(12) United States Patent
Sarver

(10) Patent No.: US 7,824,500 B1
(45) Date of Patent: Nov. 2, 2010

(54) SYSTEM AND METHOD FOR CLEANING A REACTOR CHAMBER OF A PUMP EXHAUST ABATEMENT SYSTEM

(75) Inventor: Roger Sarver, Gorham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 204 days.

(21) Appl. No.: 11/986,014

(22) Filed: Nov. 19, 2007

(51) Int. Cl.
  *B08B 9/00* (2006.01)
(52) U.S. Cl. ............... 134/8; 134/22.1; 134/21; 312/1
(58) Field of Classification Search ........... 134/22.1, 134/42, 8, 21; 312/1
  See application file for complete search history.

(56) References Cited

U.S. PATENT DOCUMENTS

| | | | |
|---|---|---|---|
| 4,059,903 A | 11/1977 | Piet et al. | |
| 4,108,509 A | 8/1978 | Piet et al. | |
| 5,141,272 A * | 8/1992 | Veillette | 292/338 |
| 5,299,243 A | 3/1994 | Picco | |
| 6,235,072 B1 | 5/2001 | Kopylov et al. | |
| 6,428,122 B1 * | 8/2002 | Henry et al. | 312/1 |
| 6,761,160 B1 * | 7/2004 | Haygood | 126/25 R |
| 6,843,541 B1 | 1/2005 | Mills et al. | |
| 6,851,769 B2 | 2/2005 | Hauville | |
| 7,381,127 B2 * | 6/2008 | Price | 454/56 |
| 2007/0066075 A1 | 3/2007 | Yuge | |
| 2008/0142047 A1 * | 6/2008 | Buccos | 134/21 |

OTHER PUBLICATIONS

"Gloveboxes Hoods & Vacuum Chambers", 2006 Terra Universal, Inc., Mini-Catalog, vol. 3, No. 11, 44 pages.
Professor Pi, "glove box", Jul. 30, 2002, 3 pages.

* cited by examiner

*Primary Examiner*—Michael Komakov
*Assistant Examiner*—Naomi Birbach

(57) ABSTRACT

A system and a method are disclosed for cleaning a reactor chamber of a pump exhaust abatement system. During the cleaning of the reactor chamber a transparent protective shield is temporarily mounted on an opening of a cabinet that contains the reactor chamber. The transparent protective shield has apertures and associated glove mounts that allow protective gloves to be placed through the apertures. This allows a technician to have gloved access to clean the reactor chamber within the cabinet. The transparent protective shield protects the technician from exposure to pollutants during the time that the reactor chamber is being cleaned. The transparent protective shield is removed after the cleaning process has been completed.

20 Claims, 4 Drawing Sheets

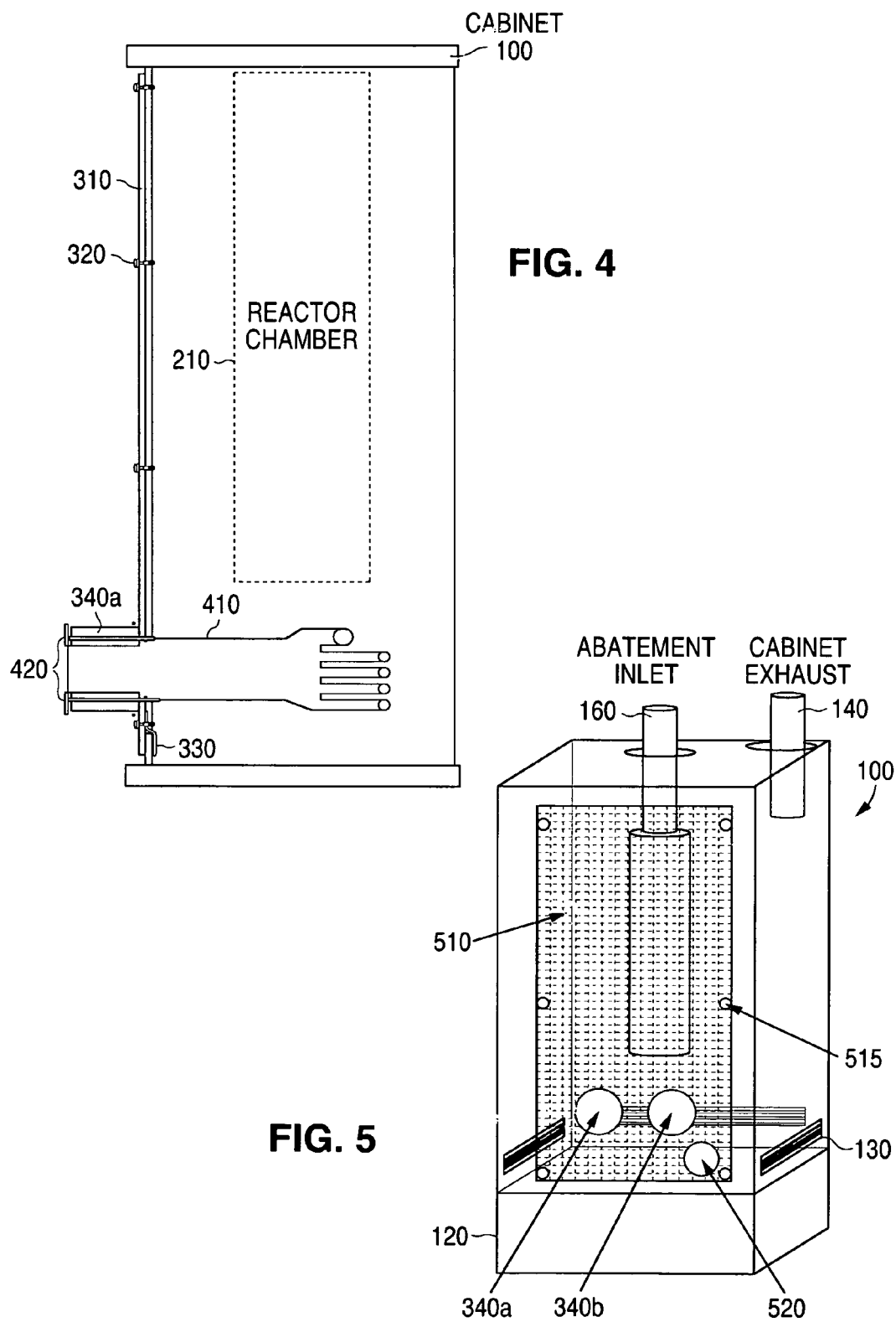

SYSTEM AND METHOD FOR CLEANING A REACTOR CHAMBER OF A PUMP EXHAUST ABATEMENT SYSTEM

TECHNICAL FIELD OF THE INVENTION

The present invention is generally directed to methods for cleaning exhaust abatement equipment and, in particular, to a system and method for cleaning a reactor chamber of a pump exhaust abatement system.

BACKGROUND OF THE INVENTION

In the semiconductor manufacturing industry various types of chemical processes (e.g., chemical vapor deposition) are used to manufacture integrated circuits and other devices. Some of the chemical processes that are used may generate undesirable chemical pollutants that contaminate the environment. It is very important that the creation of these chemical pollutants be controlled and that these chemical pollutants not be allowed to escape into the environment.

Abatement methods have been developed to minimize or eliminate the creation of these hazardous pollutants and prevent them from being released into the atmosphere. The exhaust gases from a chemical process are typically processed in a reactor chamber in order to trap and remove the pollutants from the exhaust gases. Some well known pollutants are tetraethyloxysilane (TEOS), silane ($SiH_4$) and tungsten (W).

For example, a reactor chamber that removes tungsten dust from an exhaust gas operates by heating the exhaust gas and by reacting the heated exhaust gas with water. The tungsten particles that are removed from the exhaust gas collect on the interior walls of the reactor chamber. Other types of chemical processes are used for different types of pollutants.

The reactor chamber in a pump exhaust abatement system must be periodically cleaned in order to perform properly. Over time the pollutant that is trapped by the reactor chamber (e.g., tungsten) will accumulate and diminish the efficiency of the reactor chamber. Therefore the accumulated pollutants must be periodically removed from the reactor chamber. A prior art method for cleaning a reactor chamber will now be described with reference to FIG. 1 and FIG. 2.

FIG. 1 illustrates an external view of a prior art cabinet 100 that contains a prior art reactor chamber (not shown in FIG. 1). The cabinet 100 is placed on a base 120. Cabinet vents 130 are provided through side walls of the cabinet to allow air from the ambient atmosphere to reach the interior of the cabinet 100. A cabinet exhaust port 140 through the top of the cabinet 100 is also provided. A pump (not shown) that is connected to the cabinet exhaust port 140 removes air from the interior of the cabinet 100 when the reactor chamber is operating to create a reduction in atmospheric pressure within the interior of the cabinet 100. This reduction in atmospheric pressure within the interior of the cabinet 100 tends to keep any pollutants that may escape from the reactor chamber within the cabinet 100.

Access to the interior of the cabinet 100 is through a door 150 through a side wall of the cabinet 100. An abatement inlet 160 through the top of the cabinet 100 provides a flow of exhaust gas to the reactor chamber 210 (shown in FIG. 2).

FIG. 2 illustrates an interior view of the cabinet 100 in which the door 150 is open. The reactor chamber 210 receives a flow of exhaust gases from the abatement inlet 160. The reactor chamber 210 operates to remove the pollutant (e.g., tungsten) from the flow of exhaust gases as previously described. The flow of exhaust gases leaves the reactor chamber 210 through an abatement outlet (not shown in FIG. 2) through a wall of the cabinet 100.

When it is time to clean the reactor chamber 210 a technician who performs a prior art cleaning method must put on personal protective gear. The protective gear is necessary because of the toxic and dangerous nature of the pollutant that has been accumulated in the reactor chamber 210. The protective gear generally must include gloves, an apron, and a breathing mask with a self contained source of breathable air from an air tank. Due to safety regulations a second person must also be present during the cleaning operation because the cleaning technician is using a breathing mask and self contained breathing equipment.

The technician opens the door 150 and disconnects the reactor chamber 210 from the abatement outlet (not shown) and removes a bottom flange (not shown) from the reactor chamber 210. The technician then removes the accumulated pollutant from the reactor chamber. For example, in the case of removing tungsten from the reactor chamber, the technician scrapes the interior walls of the reactor chamber 210 and places tungsten debris into a bag for subsequent removal. This method causes tungsten dust to spill out into the environment around the cabinet 100.

After the reactor chamber 210 has been cleaned, the technician removes the bag with the accumulated tungsten, replaces the bottom flange on the reactor chamber 210 and reconnects the reactor chamber to the abatement outlet. The technician then closes the door 150 of the cabinet 100. The reactor chamber 210 is then ready to go back into operation. This prior art method unavoidably releases some tungsten dust into the environment.

Therefore, there is a need in the art for a system and method that is capable of providing an improved method for cleaning a reactor chamber of a pump exhaust abatement system. There is a need in the art for a system and method that is capable of cleaning a reactor chamber of a pump exhaust abatement system while minimizing the release of pollutants into the environment.

SUMMARY OF THE INVENTION

To address the above-discussed deficiencies of the prior art, it is a primary object of the present invention to provide a system and method for cleaning a reactor chamber of a pump exhaust abatement system that minimizes the release of pollutants into the environment.

One advantageous embodiment of the invention comprises a transparent protective shield that is temporarily mounted on the door opening of the cabinet during the cleaning of the reactor chamber. The transparent protective shield has apertures and glove mounts associated with the apertures that allow protective gloves to be placed through the apertures. The apertures through the transparent protective shield and the associated glove mounts allow the technician to have gloved access to the reactor chamber in the interior of the cabinet when the transparent protective shield is temporarily mounted on the door opening of the cabinet during the cleaning process. The transparent protective shield protects the technician from exposure to pollutants during the cleaning of the reactor chamber.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art should appreciate that they may readily use the conception and the specific embodiment disclosed as a basis for modifying or designing other structures for carrying out the same purposes of the present invention. Those skilled in the art should also realize that such equivalent constructions do not depart from the spirit and scope of the invention in its broadest form.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 4 is a cross sectional view of a cabinet and a reactor chamber and a protective shield of the present invention mounted on the door opening of the cabinet;

FIG. 5 is a perspective view of an another advantageous embodiment of a transparent protective shield of the present invention.

DETAILED DESCRIPTION OF THE INVENTION

Figure 1:
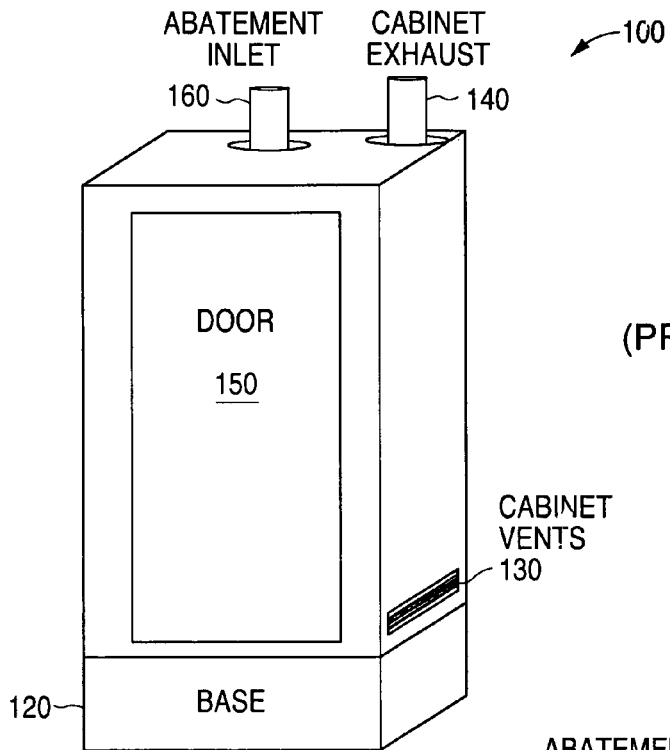
FIG. 1 is a perspective view showing an external view of a prior art cabinet that contains a prior art reactor chamber of a pump exhaust abatement system.
Figure 2:
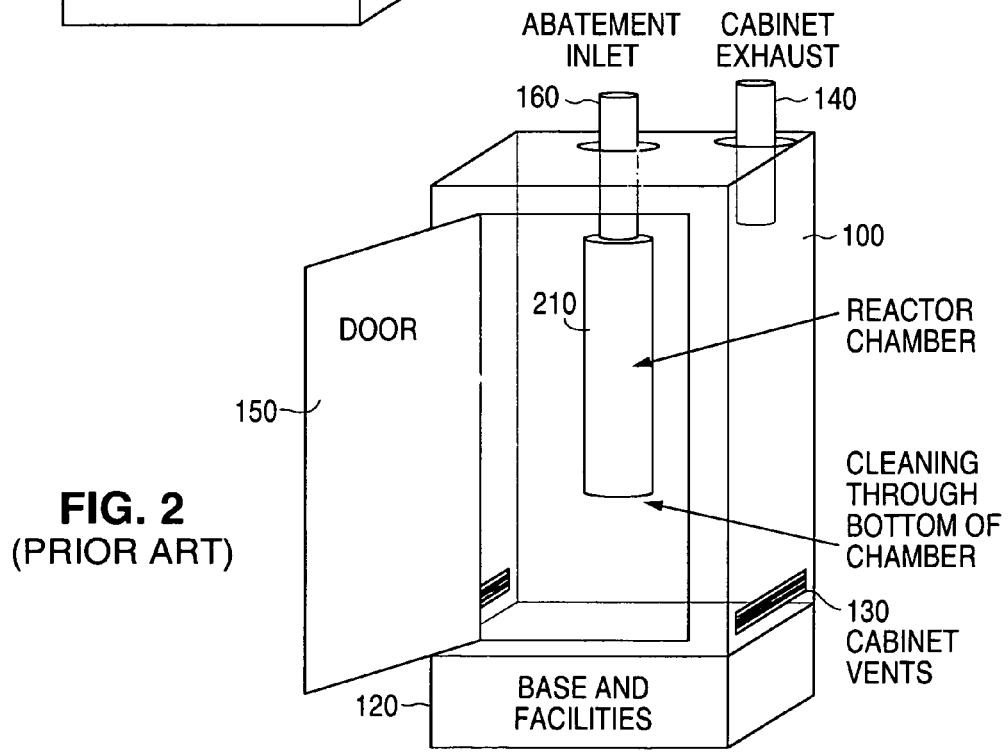
FIG. 2 is a perspective view showing an internal view of the prior art cabinet that is shown in FIG. 1.

FIGS. 3 through 6 and the various embodiments used to describe the principles of the present invention in this patent document are by way of illustration only and should not be construed in any way to limit the scope of the invention. Those skilled in the art will understand that the principles of the present invention may be implemented in any type of suitably arranged reaction chamber for a pump exhaust abatement system.

To simplify the drawings the reference numerals from previous drawings will sometimes not be repeated for structures that have already been identified.

The present invention solves the problems that are present in the prior art method by providing a transparent protective shield that is temporarily mounted on the door opening of the cabinet during the cleaning process. The transparent protective shield has apertures and glove mounts associated with the apertures that allow protective gloves to be placed through the apertures. The apertures through the transparent protective shield and the associated glove mounts allow the technician to have gloved access to the reactor chamber in the interior of the cabinet when the transparent protective shield is mounted on the door opening of the cabinet.

Figure 3:
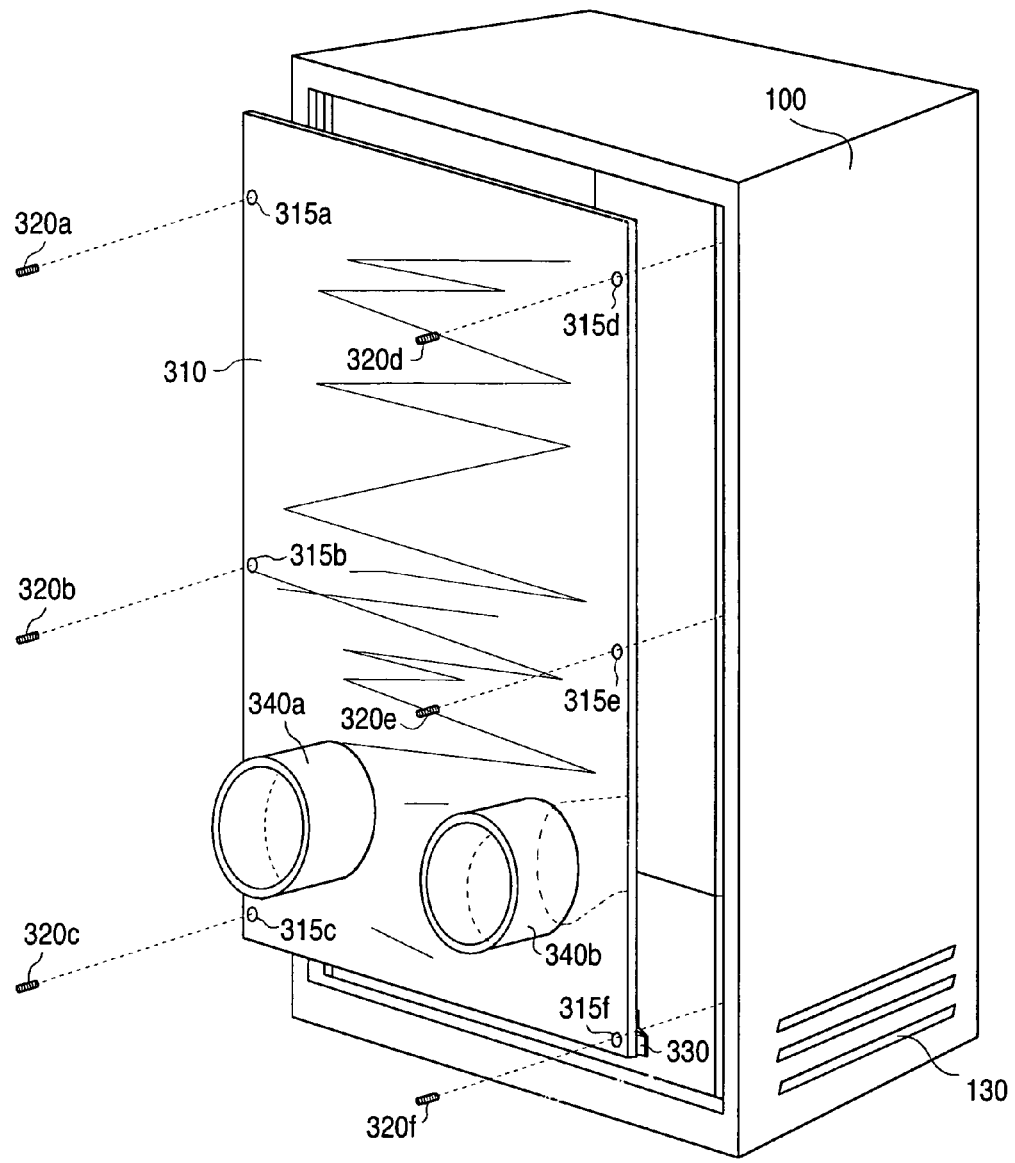
FIG. 3 is a perspective view of a cabinet and an advantageous embodiment of a transparent protective shield of the present invention for use with an advantageous embodiment of a method of the present invention.

FIG. 3 is a perspective view 300 of an advantageous embodiment of a transparent protective shield 310 of the present invention. In one advantageous embodiment the transparent protective shield 310 comprises a transparent plastic material. For example, the transparent protective shield may be made of a polymethylmethacrylate material such as Plexiglas® (a registered trademark of Altuglas International). The transparent protective shield 310 is formed having a shape that allows the transparent protective shield 310 to mounted on the door opening of the cabinet 100 when door 150 is removed from the cabinet 100.

In an advantageous embodiment of the cleaning method of the present invention, the technician first terminates the operation of the reactor chamber 210. The technician then removes the door 150 of the cabinet 100. The technician then mounts the transparent protective shield 310 into the door opening of the cabinet 100. In one advantageous embodiment the transparent protective shield 310 is formed with apertures (315a to 315f) that receive fasteners such as mounting screws (320a to 320f). The door frame of the cabinet 100 is also provided with apertures (not shown) to receive the screws 320. The mounting screws (320a to 320f) that are shown in FIG. 3 are shown as examples. It is understood that other types of fasteners may also be used.

In one advantageous embodiment of the invention a mounting bracket 330 is attached to the bottom of the transparent protective shield 310. The mounting bracket 330 guides the placement of the transparent protective shield 310 into the door frame of the cabinet 100.

The mounting screws 320 hold the transparent protective shield 310 against door frame of the cabinet 100 so that there is no access for pollutant material within the interior of the cabinet 100 to escape past the juncture between the door frame of the cabinet 100 and the transparent protective shield 310.

The transparent protective shield 310 is formed with portions that form a first aperture through the transparent protective shield 310 and an associated glove mount 340a. The transparent protective shield 310 is also formed with portions that form a second aperture through the transparent protective shield 310 and an associated glove mount 340b. The two glove mounts 340a and 340b are collectively referred to as glove mounts 340. The apertures and the associated glove mounts 340 allow protective gloves (not shown in FIG. 3) to be placed through the apertures.

FIG. 4 is a cross sectional view of the cabinet 100 and the reactor chamber 210 and the transparent protective shield 310 mounted on the door opening of the cabinet 100. A protective glove 410 is placed within each of the two glove mounts 340 and clamped in place with a glove clamp 420. The glove clamp 420 holds the protective glove 410 in place within the glove mount 340. The glove clamp 420 also prevents accumulation of dust between the protective glove 410 and the glove mount 340. This arrangement is shown in cross section for one protective glove 410 in FIG. 4. The two protective gloves 410 may be placed within the two glove mounts 340 and secured by the two glove clamps 420 before the transparent protective shield 310 is mounted on the door opening of the cabinet 100.

After the technician has mounted the transparent protective shield 310 (with the protective gloves 410) on the door opening of the cabinet 100, the technical places his or her hands in the protective gloves 410 to access the reactor chamber 210. The presence of the transparent protective shield 310 prevent the pollutants from the reactor chamber 210 (e.g., tungsten) from escaping from the interior of the cabinet 100 while the technician is cleaning the reactor chamber 210. The transparency of the transparent protective shield allows the technician to clearly see the reactor chamber 210 during the cleaning process.

During the cleaning process the technician disconnects the reactor chamber 210 from the abatement outlet (not shown) and removes the bottom flange (not shown) of the reactor chamber 210. The technician then cleans the reactor chamber 210. For example, in the case of removing tungsten from the reactor chamber 210 the technician scrapes the interior walls of the reactor chamber 210 to remove the tungsten and places the tungsten debris in a collection bag (not shown). The collection bag is placed within the interior of the cabinet 100 before the transparent protective shield 310 is mounted.

After the reactor chamber 210 has been cleaned the technician replaces the bottom flange (not shown) of the reactor chamber 210 and reconnects the reactor chamber 210 to the abatement outlet (not shown). The technician then removes the fasteners 320 and removes the transparent protective shield 310 from the door opening of the cabinet 100. The technician then removes the collection bag from the interior of the cabinet 100 and replaces the door 150 of the cabinet 100.

The use of the transparent protective shield 310 of the invention protects the technician from the dust and debris of the pollutant that escapes from the reactor chamber 210 during the cleaning of the reactor chamber 210. The dust and debris of the pollutant remains largely contained within the interior of the cabinet 100 and does not escape into the atmosphere. The pump (not shown) that is connected to the cabinet exhaust port 140 that reduces the level of atmospheric pressure within the cabinet 100 may be operated during the cleaning process while the transparent protective shield 310 is temporarily mounted on the door opening of the cabinet 100. This helps contain the pollutants within the interior of the cabinet 100 during the cleaning process.

Because the apparatus and method of the present invention provides good protection from the pollutant material during the cleaning process the technician does not have to wear special protective clothing and does not have to wear a breathing mask with a self contained source of breathable air from an air tank. There is therefore no need to have a second person present as an observer when the apparatus and method of the invention is used. As previously mentioned, due to safety regulations a second person must be present as an observer when a technician is using a breathing mask and self contained breathing equipment.

FIG. 5 is a perspective view of another advantageous embodiment of a transparent protective shield 510 of the present invention. Like the transparent protective shield 310, the transparent protective shield 510 that is shown in FIG. 5 is also formed with portions that form a first aperture through the transparent protective shield 510 and an associated glove mount 340a and that form a second aperture through the transparent protective shield 510 and an associated glove mount 340b. Transparent protective shield 510 is also formed with apertures 515 that receive fasteners such as mounting screws (not shown).

The transparent protective shield 510 also comprises an aperture 520 for receiving a vacuum hose (not shown). The technician who cleans the reactor chamber in the cabinet uses the protective gloves (not shown in FIG. 5) to employ a vacuum hose in the cleaning process. The vacuum hose carries away the pollutant materials from the reactor chamber through the aperture 520 to a disposal container (not shown). The juncture between the aperture 520 and the vacuum hose is sealed sufficiently tightly so that no pollutant material can escape from the interior of the cabinet during the cleaning process.

Figure 6:
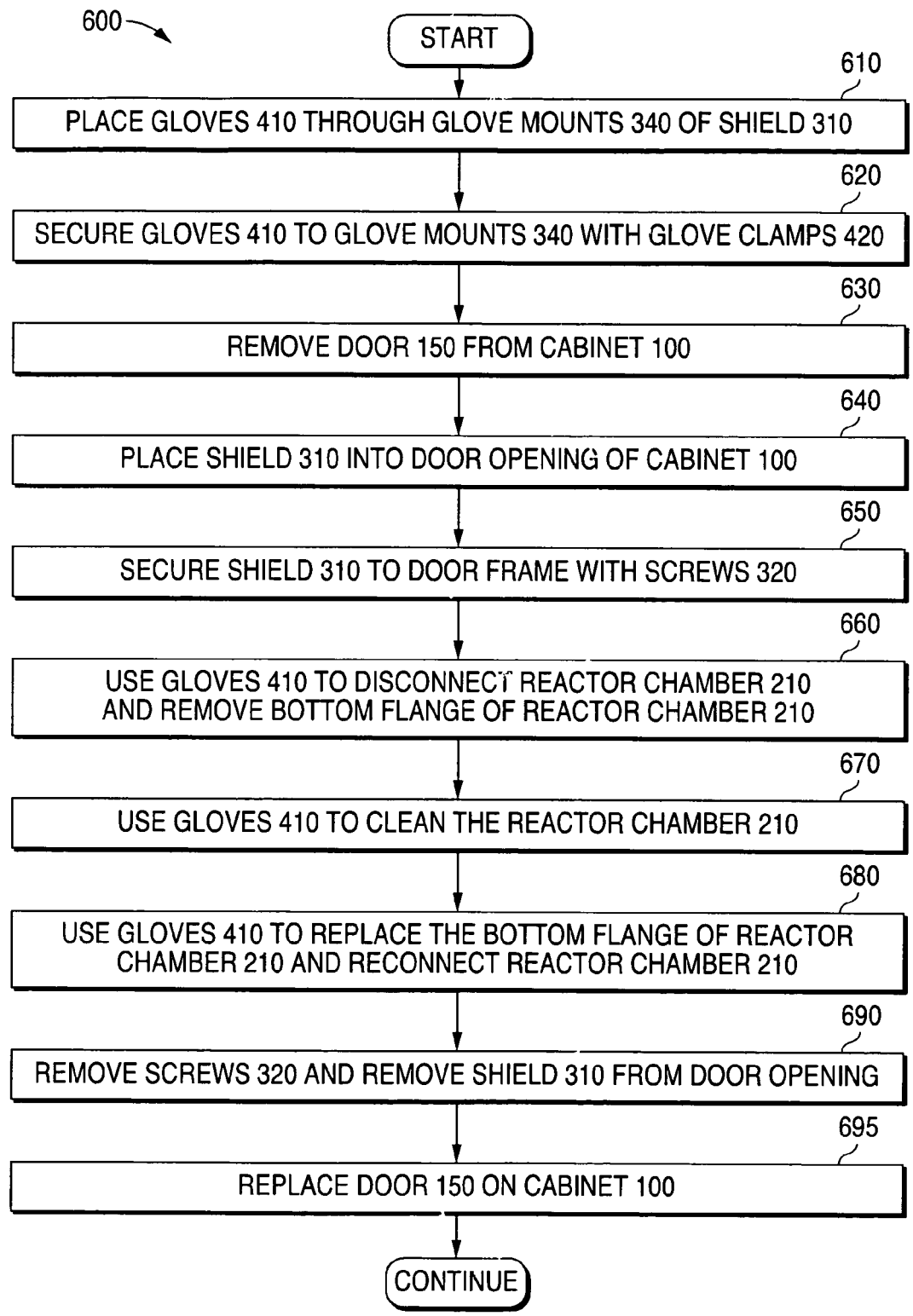
FIG. 6 illustrates a flow chart showing the steps of an advantageous embodiment of the method of the invention.

FIG. 6 illustrates a flow chart 600 showing the steps of an advantageous embodiment of the method of the invention. In the first step of the method the technician places the protective gloves 410 through the glove mounts 340 of the transparent protective shield 310 (step 610). Then the technician secures the protective gloves 410 to the glove mounts 340 with the glove clamps 420 (step 620).

Then the technician removes the door 150 from the cabinet 100 (step 630). Then the technician places the transparent protective shield 310 into the door opening of the cabinet 100 (step 640). Then the technician secures the transparent protective shield 310 to the door frame of the cabinet 100 with screws 320 (step 650).

Then the technician uses the protective gloves 410 to disconnect the reactor chamber 210 from the abatement outlet and to remove the bottom flange of the reactor chamber 210 (step 660). Then the technician uses the protective gloves 410 to clean the reactor chamber 210 (step 670). Then the technician uses the protective gloves 410 to replace the bottom flange of the reactor chamber 210 and reconnect the reactor chamber 210 to the abatement outlet (step 680).

Then the technician removes the screws 320 that hold the transparent protective shield 310 in place and removes the transparent protective shield 310 from the door opening (step 690). Then the technician replaces the door 150 on the cabinet 100 (step 695).

Although the present invention has been described with an exemplary embodiment, various changes and modifications may be suggested to one skilled in the art. It is intended that the present invention encompass such changes and modifications as fall within the scope of the appended claims.

What is claimed is:

1. A method comprising:
cleaning a reactor chamber of a pump exhaust abatement system that is located within a cabinet having a door and associated with a pump configured to maintain a reduction in atmospheric pressure within an interior of the cabinet, wherein the cleaning comprises:
removing the door of the cabinet;
mounting a transparent protective shield that has protective gloves that enable a user to access the cabinet through the transparent protective shield on a door frame of the cabinet; and
using the protective gloves to clean the reactor chamber.

2. The method as set forth in claim 1 further comprising the steps of:
removing the transparent protective shield from the door frame of the cabinet after the reactor chamber has been cleaned; and
replacing the door of the cabinet.

3. The method as set forth in claim 1 wherein the step of using the protective gloves to clean the reactor chamber further comprises the steps of:
using the protective gloves to disconnect the reactor chamber from an abatement outlet of the cabinet; and
using the protective gloves to remove a bottom flange of the reactor chamber.

4. The method as set forth in claim 3 wherein the step of using the protective gloves to clean the reactor chamber further comprises the step of:

using the protective gloves to scrape a pollutant material from the reactor chamber; and using the protective gloves to place the pollutant material from the reactor chamber in a bag.

5. The method as set forth in claim 1 wherein the step of mounting the transparent protective shield on the door frame of the cabinet comprises the step of:

aligning the protective shield with the door frame using a mounting bracket that is attached to a bottom of the transparent protective shield.

6. The method as set forth in claim 1 further comprising providing the transparent protective shield by:

providing the transparent protective shield with at least one glove mount that is associated with an aperture through the transparent protective shield;

placing a protective glove through the at least one glove mount; and securing the protective glove in the at least one glove mount using a glove clamp.

7. The method as set forth in claim 1 further comprising the step of:

operating the pump that is connected to a cabinet exhaust of the cabinet to reduce the atmospheric pressure within the cabinet when the reactor chamber within the chamber is being cleaned.

8. The method as set forth in claim 1 wherein the step of mounting the transparent protective shield on the door frame of the cabinet comprises the step of:

mounting the transparent protective shield on the door frame sufficiently tightly so that there is no access for a pollutant material within the cabinet to escape past a juncture between the door frame of the cabinet and the transparent protective shield.

9. A method comprising:

obtaining temporary gloved access to a reactor chamber of a pump exhaust abatement system that is located within an interior of a cabinet having a door and associated with a pump configured to reduce an atmospheric pressure in the cabinet, wherein the obtaining comprises:

removing the door of the cabinet;

mounting a transparent protective shield that has protective gloves that enable a user to access the interior of the cabinet through the transparent protective shield on a door frame of the cabinet; and using the protective gloves to access the interior of the cabinet.

10. The method as set forth in claim 9 further comprising the steps of:

removing the transparent protective shield from the door frame of the cabinet after the interior of the cabinet has been accessed using the protective gloves; and replacing the door of the cabinet.

11. The method as set forth in claim 9 wherein the step of mounting the transparent protective shield on the door frame of the cabinet comprises the step of:

aligning the protective shield with the door frame using a mounting bracket that is attached to a bottom of the transparent protective shield.

12. The method as set forth in claim 9 further comprising providing the transparent protective shield by:

providing the transparent protective shield with at least one glove mount that is associated with an aperture through the transparent protective shield;

placing a protective glove through the at least one glove mount; and securing the protective glove in the at least one glove mount using a glove clamp.

13. The method as set forth in claim 9 further comprising the step of:

operating the pump that is connected to a cabinet exhaust of the cabinet to reduce the atmospheric pressure within the cabinet when the interior of the cabinet is being accessed.

14. A method comprising:

cleaning a reactor chamber of a pump exhaust abatement system that is located within a cabinet having a door and associated with a pump configured to reduce an atmospheric pressure within the cabinet, wherein the cleaning comprises:

removing the door of the cabinet;

mounting a transparent protective shield that has protective gloves that enable a user to access the cabinet through the transparent protective shield on a door frame of the cabinet;

using the protective gloves to clean the reactor chamber;

removing the transparent protective shield from the door frame of the cabinet after the reactor chamber has been cleaned; and replacing the door of the cabinet.

15. The method as set forth in claim 14 wherein the step of using the protective gloves to clean the reactor chamber further comprises the steps of:

using the protective gloves to disconnect the reactor chamber from an abatement outlet of the cabinet; and using the protective gloves to remove a bottom flange of the reactor chamber.

16. The method as set forth in claim 15 wherein the step of using the protective gloves to clean the reactor chamber further comprises the step of:

using the protective gloves to scrape a pollutant material from the reactor chamber; and using the protective gloves to place the pollutant material from the reactor chamber in a bag.

17. The method as set forth in claim 14 wherein the step of mounting the transparent protective shield on the door frame of the cabinet comprises the step of:

aligning the protective shield with the door frame using a mounting bracket that is attached to a bottom of the transparent protective shield.

18. The method as set forth in claim 14 further comprising providing the transparent protective shield by:

providing the transparent protective shield with at least one glove mount that is associated with an aperture through the transparent protective shield;

placing a protective glove through the at least one glove mount; and securing the protective glove in the at least one glove mount using a glove clamp.

19. The method as set forth in claim 14 further comprising the step of operating the pump that is connected to a cabinet exhaust of the cabinet to reduce the atmospheric pressure within the cabinet when the reactor chamber within the chamber is being cleaned.

20. The method as set forth in claim 14 wherein the step of mounting the transparent protective shield on the door frame of the cabinet comprises the step of:

mounting the transparent protective shield on the door frame sufficiently tightly so that there is no access for a pollutant material within the cabinet to escape past a juncture between the door frame of the cabinet and the transparent protective shield.

* * * * *